(12) United States Patent
Renaudin et al.

(10) Patent No.: US 9,514,081 B2
(45) Date of Patent: Dec. 6, 2016

(54) ASYNCHRONOUS CIRCUIT WITH SEQUENTIAL WRITE OPERATIONS

(71) Applicant: TIEMPO, Montbonnot St-Martin (FR)

(72) Inventors: Marc Renaudin, Biviers (FR); Alain Fonkoua, Grenoble (FR); Yannick Monnet, Le Sappey-en-Chartreuse (FR); Yassine Rjimati, Seyssinet (FR)

(73) Assignee: TIEMPO, Montbonnot St-Martin (FR)

( * ) Notice: Subject to any disclaimer, the term of this patent is extended or adjusted under 35 U.S.C. 154(b) by 755 days.

(21) Appl. No.: 14/026,371

(22) Filed: Sep. 13, 2013

(65) Prior Publication Data

US 2014/0075084 A1   Mar. 13, 2014

(30) Foreign Application Priority Data

Sep. 13, 2012   (FR) ...................................... 12 02446

(51) Int. Cl.
*G06F 13/40* (2006.01)
*G06F 13/42* (2006.01)
*H03K 19/21* (2006.01)

(52) U.S. Cl.
CPC ........... *G06F 13/4022* (2013.01); *G06F 13/42* (2013.01); *H03K 19/21* (2013.01)

(58) Field of Classification Search
CPC .. G06F 13/40; G06F 13/4004; G06F 13/4022; G06F 13/4027; G06F 13/405; G06F 13/42; H03K 19/21
See application file for complete search history.

(56) References Cited

U.S. PATENT DOCUMENTS

| | | | | |
|---|---|---|---|---|
| 5,646,554 | A | * | 7/1997 | Kim ........................... G06F 1/10 326/93 |
| 6,486,700 | B1 | | 11/2002 | Fairbanks et al. |
| 6,922,090 | B2 | * | 7/2005 | Takeda ....................... G06F 7/00 326/93 |
| 8,106,683 | B2 | * | 1/2012 | Nijssen .............. H03K 19/0966 326/41 |
| 2003/0095556 | A1 | | 5/2003 | Horie et al. |

(Continued)

OTHER PUBLICATIONS

Sparsø. "Asynchronous Circuit Design: A Tutorial". Technical University of Denmark. 2006.*

(Continued)

*Primary Examiner* — Thomas J Cleary
(74) *Attorney, Agent, or Firm* — Oliff PLC

(57) ABSTRACT

The asynchronous circuit includes an input channel, a divergence operator connecting the input channel to a plurality of intermediate channels, a convergence operator gathering the intermediate channels into a single output channel, a main sequencer including a plurality of sequentially-activated control channels, each intermediate channel being associated to a control channel, and a switch arranged in a request path of one of the intermediate channels and connected to the last active control channel. The circuit further includes a memory circuit, arranged in each of the other intermediate channels, connected to the associated control channel and configured to transmit the request signal of the associated intermediate channel to the output channel and to modify an output state of the associated intermediate channel, by means of the main sequencer, without requiring any state change of the input channel.

8 Claims, 10 Drawing Sheets

(56) References Cited

U.S. PATENT DOCUMENTS

2012/0106334 A1* 5/2012 Tanaka ................. G06F 13/362
370/230

OTHER PUBLICATIONS

Guan et al. "Quasi Delay-Insensitive High Speed Two-Phase Protocol Asynchronous Wrapper for Network on Chips". Journal of Computer Science and Technology. Sep. 2010. pp. 1092-1100.*
Brown et al. "Retargeting a Hardware Complier Proof using Protocol Converters". Proceedings of the International Symposium on Advanced Research in Asynchronous Circuits and Systems. 1994. IEEE. pp. 54-63.*
Dobkin et al. "Zero latency synchronizers using four and two phase protocols". Oct. 2007. VLSI Systems Research Center, Technion-lsrael Institute of Technology.*
Josephs et al. "Modeling and Design of Asynchronous Circuits". Proceedings of the IEEEE. vol. 87, No. 2. Feb. 1999. IEEE. pp. 234-242.*

* cited by examiner

ASYNCHRONOUS CIRCUIT WITH SEQUENTIAL WRITE OPERATIONS

BACKGROUND OF THE INVENTION

The invention relates to the design of asynchronous circuits, and more specifically to asynchronous circuits modeled according to a two-phase handshake communication protocol and implemented according to a four-phase handshake protocol.

STATE OF THE ART

Unlike synchronous circuits, asynchronous circuits use no general clock signal to synchronize the execution of its components. Asynchronous circuit components synchronize locally, using a request-and-acknowledge type communication protocol. Any transmission of data between a sender component and a receiver component has to be acknowledged by the receiver in order for the sender to be able to transmit again.

The components communicate together over channels. Each channel thus comprises a request path and an acknowledgement path. They further exchange data. Such data are commonly encoded to directly integrate the validity information formed by the request. In this case, each data bit is encoded over at least two wires.

It is also possible to use a single wire per data bit and to convey the validity information independently from the data, over a separate wire. In this case, the request and the data are separate signals.

The most commonly-used protocol is the four-phase handshake protocol, also called "return-to-zero" protocol. The protocol comprises the following different phases:
   Phase 1: the sender sends a request signal to the receiver;
   Phase 2: the receiver detects the request signal, processes the data, and generates an acknowledgement signal;
   Phase 3: the sender detects the acknowledgement signal and invalidates the request signal; and
   Phase 4: the receiver detects the invalid state of the request signal and deactivates the acknowledgement signal.

The sender detects the inactive state of the acknowledgement signal and can then transmit a new request and new data (if available), which marks the beginning of a new communication cycle.

The two-phase handshake protocol, also called half-handshake protocol, only comprises the first two phases. As previously, each change of the request signal is acknowledged by the acknowledgement signal, and vice versa. However, there is no return to the invalid states of the request signal and of the acknowledgement signal (phases 3 and 4).

The two-phase handshake protocol implies fewer transitions. A circuit implementing it should thus be faster and more energy-efficient. In practice, however, the circuit is implemented to operate with the four-phase handshake protocol. Indeed, it is simpler to implement the four-phase handshake protocol since the number of possible states is limited. The two-phase handshake protocol remains advantageous to describe and simulate the circuit behavior before the synthesis, due to its high speed.

FIG. 1 schematically shows a device commonly used in asynchronous circuits, for providing a rendezvous between channels. Such a device enables to transfer data, for example, from an input channel A to an output channel Z. The request signal and the acknowledgement signal of channel A are respectively noted $A_{req}$ and $A_{ack}$. The request signal and the acknowledgement signal of channel Z are respectively noted $Z_{req}$ and $Z_{ack}$.

The rendezvous device behaves as follows: channel A is released (and thus ready to transmit new data) only after the data have been transmitted to channel Z and after said channel Z has been released. This behavior can be simply described with a two-phase handshake protocol: request $A_{req}$ of channel A is first propagated over channel Z by signal $Z_{req}$, after which acknowledgement $Z_{ack}$ of channel Z propagates over channel A, as $A_{ack}$.

It can thus be observed that, in two phases, the connection (called biphase connection) may be limited to a simple wire (in dashed lines in FIG. 1) connecting the wires of requests $A_{req}$ and $Z_{req}$ on the one hand, and the wires of acknowledgements $A_{acq}$ and $Z_{acq}$ on the other hand. In other words, A and Z describe a same channel However, when a two-phase channel connection is transposed into four phases at the synthesis, such a simplification may result in a circuit malfunction. The circuit operates properly in two phases during the simulation before synthesis but blocks when it is simulated in four phases after synthesis.

SUMMARY OF THE INVENTION

A need therefore exists to connect channels in an asynchronous circuit while decreasing risks of circuit malfunction.

More specifically, it is aimed at improving the operation of the asynchronous circuit during the transition from a functional model described in two phases to a physical circuit implemented in four phases.

The invention tends to satisfy this need by providing, in an asynchronous circuit comprising a plurality of components connected by channels, each channel conveying a request signal and an acknowledgement signal, the following elements:
   an input channel;
   a divergence operator connecting the input channel to a plurality of intermediate channels;
   a convergence operator gathering the intermediate channels in a single output channel;
   a main sequencer comprising a plurality of sequentially-activated control channels, each intermediate channel being associated to a control channel;
   a switch arranged in a request path of one of the intermediate channels, and connected to the last active control channel, whereby the transmission of the request signal of said intermediate channel to the output channel occurs last in the sequence;
   a memory circuit, arranged in each of the other intermediate channels, connected to the associated control channel and configured to transmit the request signal from the associated intermediate channel to the output channel; and
the storage circuit being further configured to modify an output state of the associated intermediate channel, by means of the main sequencer, without requiring any state change of the input channel.

Preferably, the switch is formed of a Muller C-element receiving as inputs the request signal of the associated intermediate channel and the request signal of the associated control channel.

In a first embodiment of the invention, the memory circuit comprises an AND gate receiving as inputs the request signal from the associated intermediate channel and the request signal from the associated control channel.

In a second embodiment of the invention, the memory circuit comprises an asymmetrical Muller C-element provided with a first input receiving the request signal of the associated intermediate channel and with a second input receiving the request signal of the associated control channel, the first input conditioning only one of the transitions of the asymmetrical Muller C-element.

In a third embodiment of the invention, the memory circuit comprises a Muller C-element receiving as inputs the request signal of the associated intermediate channel and the request signal of the associated control channel of the main sequencer. It further comprises a secondary sequencer provided with a first control channel coupled to an output of the associated intermediate channel via the Muller C-element and with a second control channel coupled to an input of the associated intermediate channel.

According to a development of the invention, the last active control channel of the main sequencer can receive either a request signal from a control circuit, or the request signal from the input channel, or the acknowledgement signal from the associated intermediate channel and a signal for resetting the sequencer.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT

In the following description, the request and the acknowledgement designate local control signals which enable to synchronize two components of an asynchronous circuit. The wires conveying these signals form a communication channel between the two components.

The request signal may be associated with the data which transit between the two components. In this case, the request and the data form a same signal, of several bits, each bit being encoded over at least two wires or rails (dual-rail encoding, for example). In other words, the request signal is not necessarily conveyed by a single wire.

Figure 1:
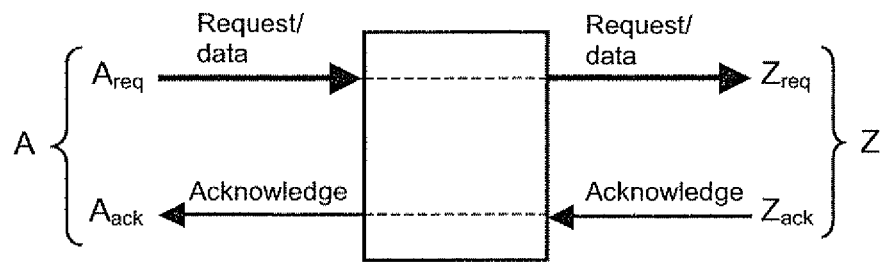
FIG. 1, previously described, is a simplified representation of a channel connection in an asynchronous circuit.

The inventors have observed that a connection between channels, having its behavior described in two phases, generates after synthesis a blocking of the circuit when the connection implements sequential write operations. In the example of FIG. 1, this consists in propagating request $A_{req}$ several times from channel A to channel Z before releasing channel A. Thus, channel A is only read once and channel Z is written several times.

Figure 2:
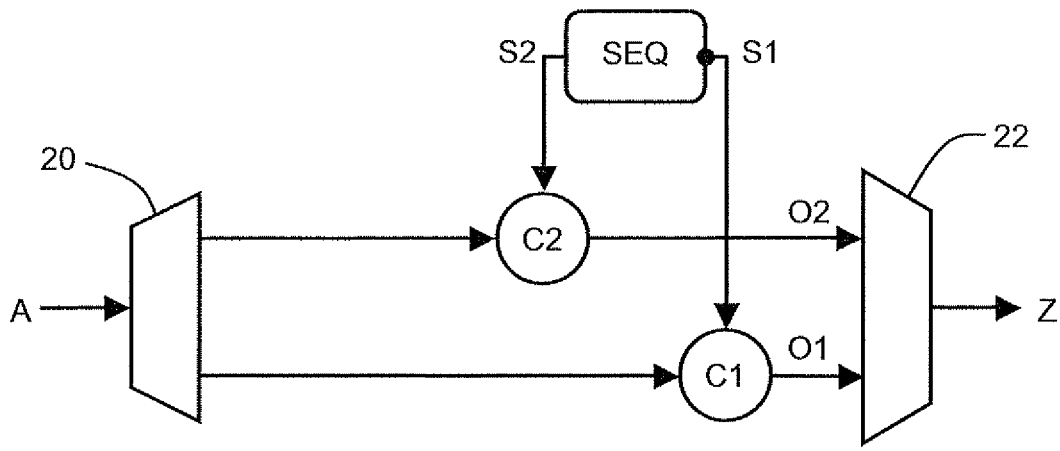
FIG. 2 is a block diagram of an asynchronous circuit with sequential write operations between an input channel and an output channel, which results in a malfunction.

FIG. 2 is a block diagram of an asynchronous circuit with sequential write operations between an input channel A and an output channel Z. Sequential write operations on channel Z imply that input channel A diverges into a plurality of paths, and then that these paths converge towards output channel Z under control of a sequencer.

The circuit thus comprises a divergence operator 20, a convergence operator 22, and a sequencer SEQ. Divergence operator 20 distributes input channel A into several intermediate channels. The example of FIG. 2 shows two intermediate channels O1 and O2. Convergence operator 22 connects intermediate channels O1 and O2 to output channel Z.

Divergence operator 20 may be a component which duplicates input channel A in at least two intermediate channels O1 and O2 of identical size. For example, if input channel A is formed of n+1 wires or rails (n wires for the request and 1 wire for the acknowledgement), channels O1 and O2 are also formed of n+1 wires.

As a variant, divergence operator 20 may be configured to divide the n—wires request signal of input channel A into n 1-wire intermediate signals (n≥2). Each of the intermediate signals thus obtained forms the request of an intermediate channel O1, O2, and each intermediate channel further has an acknowledgement wire.

The circuit also comprises switches C1, C2 located in the intermediate channels. More specifically, each intermediate channel contains a switch between operators 20 and 22. Switches C1, C2 condition the successive write operations from channel A to channel Z by "opening" or "closing" channels O1 and O2.

Switches C1, C2 are connected to sequencer SEQ, which controls them. For this purpose, the sequencer comprises one control channel S1, S2 per switch. There thus are as many switches and control channels as there are intermediate channels.

In the example of FIG. 2, switch C1 is arranged in intermediate channel O1 and driven by control channel S1. Switch C2 is arranged in channel O2 and driven by channel S2.

Control channels S1 and S2 of the sequencer are active one after the other. Channel S1 is for example activated first in the writing sequence. The information conveyed in channel A is thus transmitted to channel Z, first via channel O1, and then via channel O2.

Each write operation on channel Z corresponds to a full cycle of the communication protocol. Accordingly, several four-phase cycles should be implemented on channel Z, even before channel A ends its own cycle. However, as will be described in relation with FIG. 10, the four-phase operation of the circuit with sequential write operations is not as expected.

Figure 3:
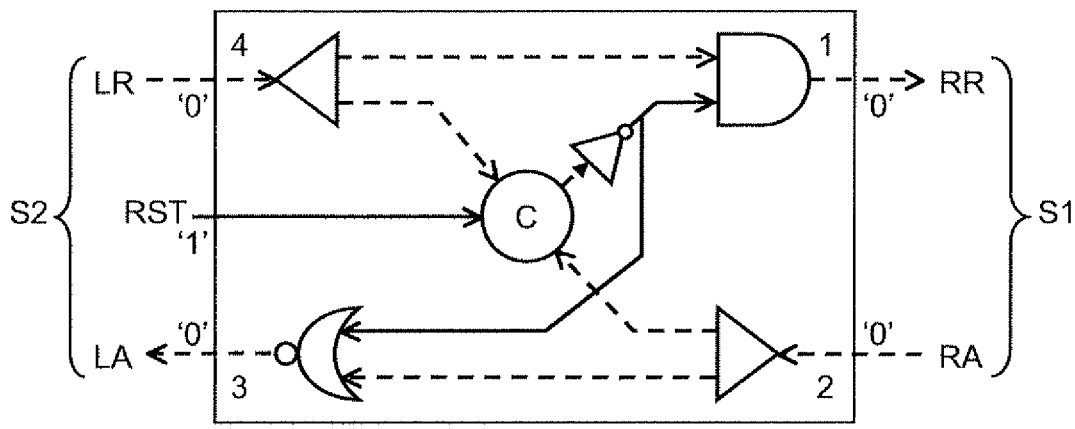
FIGS. 3 to 7 show operating steps of a sequencer used in the circuit of FIG. 2.

FIG. 3 shows in detail a sequencer with two control channels. This component, used in the circuit of FIG. 2, is however conventional in asynchronous electronics. Apart from the denomination of the control channels (S1, S2), it here appears as usually depicted in literature.

The sequencer comprises four main inputs-outputs, referred to as 1 to 4, and an input RST for resetting the sequence. On the right-hand side, output 1 and input 2 are respectively associated with a request signal RR and with an acknowledgement signal RA. The two signals correspond to channel S1 of FIG. 2. Output 3 and input 4, on the left-hand side, are respectively associated with acknowledgement signal LA and request signal LR and correspond to channel S2.

The sequencer further comprises a Muller gate C, also called "rendezvous" gate. The output of a Muller gate, Muller C-element, copies its inputs when they are identical. When the inputs differ, the output remains in its prior logic state.

Gate C receives as inputs acknowledgement signal RA from the right-hand channel (input 2) and request signal LR from the left-hand channel (input 4). Its output is connected to an input of an AND gate on the one hand, and to an input of a NOR gate on the other hand, via an inverter. The Muller gate C further receives a reset signal from input RST of the sequencer. This signal is capable of forcing the output state of the Muller gate.

Further, signal LR is duplicated towards a second input of the AND gate while signal RA is duplicated towards a second input of the NOR gate. The output signals of the AND and NOR gates respectively form the request signal RR of the right-hand channel and the acknowledgement signal LA of the left-hand channel, at outputs 1 and 3 of the sequencer.

FIGS. 3 to 7 illustrate steps of the sequencer operation, taken individually. For a better understanding, a signal in the low state (logic level '0') has been represented by a wire in dashed line and a signal in the high state (logic level '1') has been represented by a wire in a full line.

The following convention has been adopted for the sequencer: signals RR, RA, LA, and LR at inputs-outputs 1 to 4 are active in the high state and signal RST is active in the low state. In other words, the sequencer is in its initialization phase as long as signal RST is '0'.

After initialization, all signals are inactive. Signals RR, RA, LA, and LR are at '0' while signal RST is at '1'. The signal at the output of gate C is '0'. This initial state is shown in FIG. 3.

Figure 4:
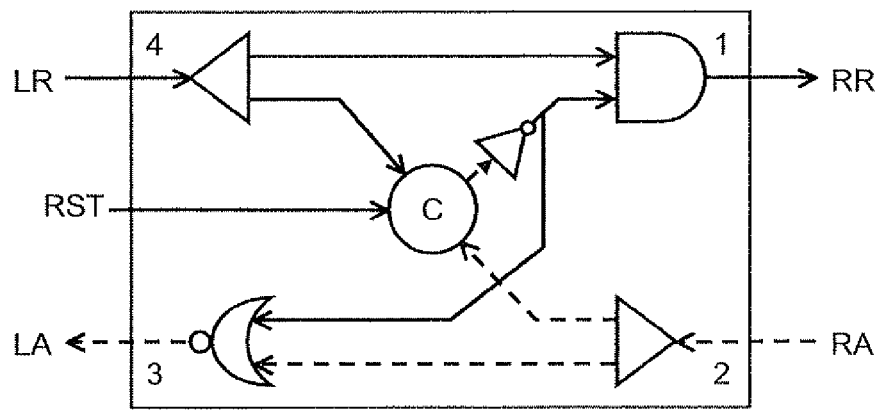

During a first step illustrated in FIG. 4, request signal LR of the left-hand channel switches to the high state ('1'), which causes the switching of the AND gate. Request signal RR of the right-hand channel, at the output of the AND gate, then switches to '1'. Gate C does not switch since its inputs LR and RA differ (LR='1' and RA='0').

At the next step (FIG. 5), acknowledgement signal RA of the right-hand channel switches to '1' as a response to the previous request RR. This results in the switching of gate C since its inputs LR and RA are now all at '1'. The output signal of gate C switches from '0' to '1', and then is inverted at the input of the AND gate. Right-hand request RR then returns to the low state ('0'), which is invalid.

Figure 6:
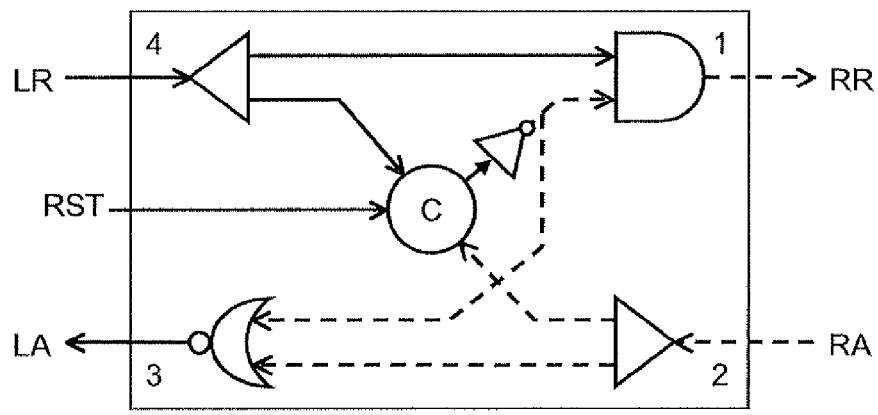
Figure 7:
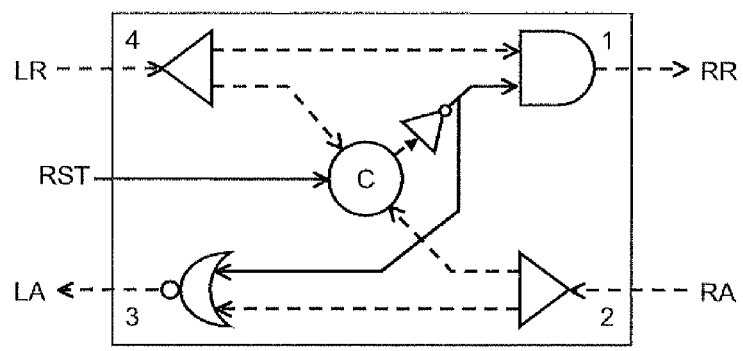

In FIG. 6, right-hand acknowledgement RA is deactivated and switches back to '0'. Gate C does not switch since its inputs are different from each other. This however causes the switching of the NOR gate which has both its inputs at '0'. Acknowledgement signal LA is then activated (LA='1').

Finally, in a last step (FIG. 7), left-hand request LR is invalidated (LR='0') due to the previous acknowledgement LA. Gate C switches back. The output signal of gate C switches state, from '1' to '0', which switching is reflected at the input of the NOR gate after inversion. As a result, left-hand acknowledgement LA is deactivated, that is, set to '0'. The sequencer returns to its initial state (FIG. 3) before starting a new cycle.

The sequence is summarized as follows:
LR='1'⇒RR='1'⇒RA='1'⇒RR='0'⇒RA='0'
⇒LA='1'⇒LR='0'⇒LA='0'

The four-phase handshake protocol is first initiated on left-hand channel S2 of the sequencer, by signal LR. Then, the four phases follow one another on right-hand channel S1, with signals RR and RA successively switching from '0' to '1' and from '1' to '0'. Finally, the last three phases of the protocol on channel S2 are carried out.

Figure 8:
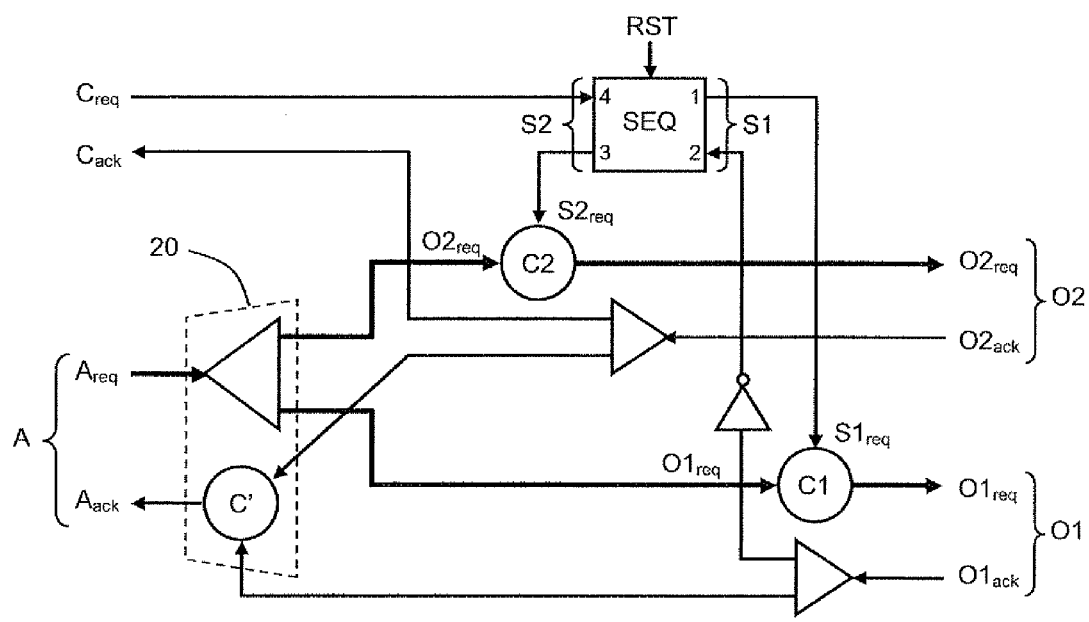
FIG. 8 shows in detail the sequential write circuit of FIG. 2, except for the convergence operator.

FIG. 8 is a detailed view of a portion of the sequential write circuit of FIG. 2. Channels A, O1, O2, S1, and S2 are split to show the request and acknowledgement circuits. The signals of each channel are designated with the channel letter, followed by abbreviation "req" for a request signal or by abbreviation "ack" for an acknowledgement signal.

FIG. 8 shows sequencer SEQ, divergence operator 20, and switches C1, C2. Operator 20 receives as an input a request signal $A_{req}$ from the input channel. Switches C1 and C2 are placed in the intermediate channels, and more specifically on the path of requests $O1_{req}$ and $O2_{req}$, which originate from operator 20.

The paths of request $O1_{req}$ and of acknowledgement $O1_{ack}$ form the intermediate communication channel O1, which extends from divergence operator 20 to the convergence operator (not shown in FIG. 8). In particular, request $O1_{req}$ propagates from operator 20 to the output channel, through switch C1. The same applies for request signal $O2_{req}$ and acknowledgement signal $O2_{ack}$, for channel O2 and switch C2.

For convenience, the request signal before the switch and the request signal after the switch have the same name: $O1_{req}$ in channel O1 and $O2_{req}$ in channel O2 (FIG. 8).

As compared with FIG. 2, the four inputs-outputs of the sequencer are now distinguished. It should be reminded that input-output 1 and 2 correspond to control channel S1 of the sequencer, coupled to intermediate channel O1, and input-output 3 and 4 correspond to control channel S2, coupled to intermediate channel O2.

Switches C1 and C2 are preferably formed of two-inputs Muller C-elements. Each Muller C-element receives as inputs a request signal of the intermediate channel where it is placed, and a request signal of the control channel coupled to this intermediate channel. Gate C1 for example receives request $O1_{req}$ of intermediate channel O1 and request $S1_{req}$ of control channel S1. Gate C2 receives as inputs request $O2_{req}$ of intermediate channel O2 and request $S2_{req}$ of control channel 52.

Requests $S1_{req}$ and $S2_{req}$ respectively come out of outputs 1 and 3 of the sequencer. Input 2 receives an acknowledgement signal $O1_{ack}$ from channel O1, after its passing through an inverter. Input 4 is connected to an auxiliary control circuit (not shown) delivering a request signal $C_{req}$ thereto.

The auxiliary control circuit enables to initiate a write sequence. Indeed, as previously described, the first sequencer operating phase starts on the left-hand channel, at input 4 (LR='1'; FIG. 4).

The auxiliary control circuit is acknowledged via a signal $C_{ack}$ which marks the end of the write sequence. Now, in this example, the information conveyed by intermediate channel O2 is written last on the output channel. This explains why signal $C_{ack}$ actually corresponds to acknowledgement signal $O2_{ack}$ of the second (and last) intermediate channel.

Acknowledgement signals $O1_{ack}$ and $O2_{ack}$ are further duplicated and directed toward the input of a Muller gate C'. The output signal of gate C' forms acknowledgement signal $A_{ack}$ of the input channel. Since Muller gate C' only switches if its inputs are equal, acknowledgement signal $A_{ack}$ is only generated when acknowledgement signals $O1_{ack}$ and $O2_{ack}$ have been generated ($O1_{ack}=O2_{ack}=$'1'). In other words, channel A can only be released after channel O1 and channel O2 have been released. The semantics of a channel connection should thus be respected.

In the example of FIG. 8, divergence operator 20 comprises a duplication operator (i.e. a fork) in the request path and the Muller gate C' in the acknowledgement path.

Figure 9:
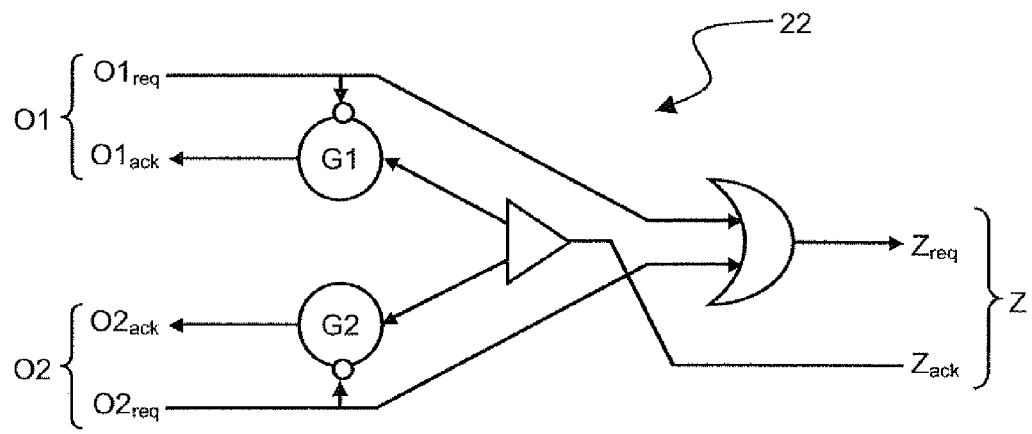
FIG. 9 shows an embodiment of the convergence operator of FIG. 2.

FIG. 9 is a conventional example of embodiment of convergence operator 22 (FIG. 2), spaced apart from FIG. 8 for the sake of readability.

Convergence operator 22 merges the two intermediate channels O1 and O2 into a single output channel Z. It comprises, in the request path, an OR gate having, as inputs, signals $O1_{req}$ and $O2_{req}$ and, as an output, signal $Z_{req}$ of the output channel.

Two Muller gate G1 and G2 are arranged in the acknowledgement path, to form signals $O1_{ack}$ or $O2_{ack}$ from signal $Z_{ack}$. Signals $O1_{req}$ and $O2_{req}$ being exclusive of each other, signals $O1_{ack}$ and $O2_{ack}$ should also be. For this purpose, signal $O1_{req}$ is looped back onto the input of Muller gate G1 and signal $O2_{req}$ is looped back onto the input of Muller gate G2.

Muller gates G1 and G2 are each equipped with an inverter, on their input receiving signal $O1_{req}$ or $O2_{req}$. Thus, gate G1 has, as input signals, signal $Z_{ack}$ and an inverted copy of signal $O1_{req}$ while gate G2 receives, as inputs, signal $Z_{ack}$ and an inverted copy of signal $O2_{req}$.

Now that the elements of the circuit with sequential write operations of FIG. 8 have been introduced, the blocking problem encountered with this circuit can be highlighted, by briefly describing its operation according to a four-phase handshake protocol.

By convention, it is considered hereafter that request signals $A_{req}$, $O1_{req}$, $O2_{req}$, and $C_{req}$ are active in the high state and that acknowledgement signals $A_{ack}$, $O1_{ack}$, $O2_{ack}$, and $C_{ack}$ are active in the low state. Since this convention differs from that selected to describe the internal operation of the sequencer, an inverter is arranged on the path of acknowledgement signal $O1_{ack}$, at input 2 of sequencer SEQ (FIG. 8).

In the initial state, all the circuit signals are at logic level '0', except for acknowledgement signals $O1_{ack}$, $O2_{ack}$, $C_{ack}$, and $A_{ack}$, which are at logic level '1'.

Figure 10:
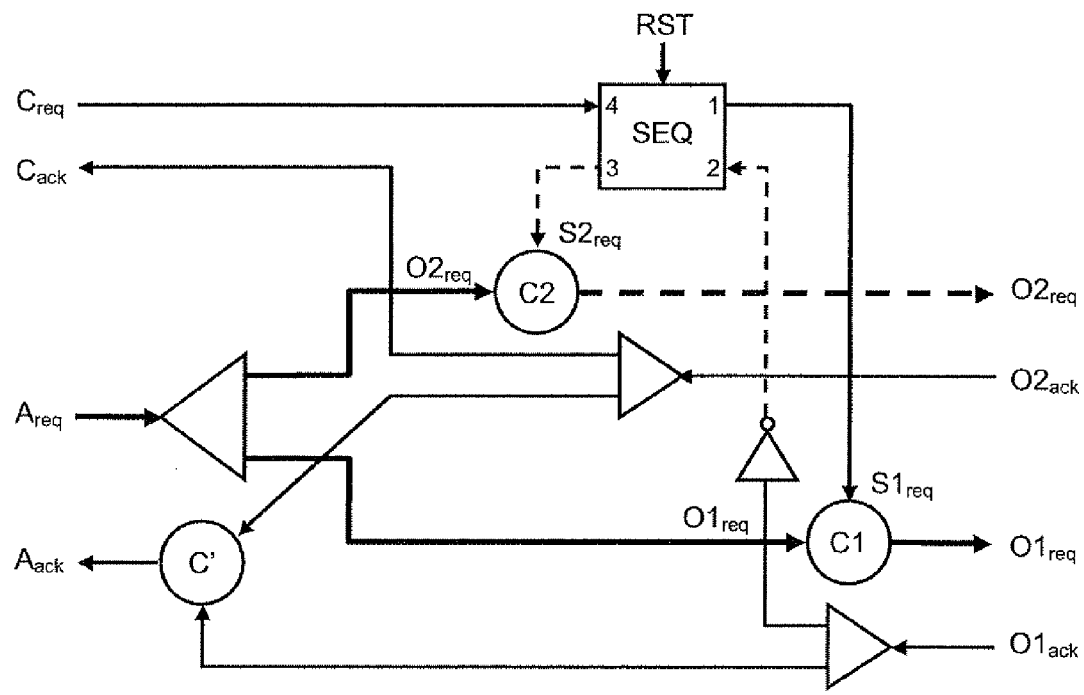
FIGS. 10 and 11 show operating steps of the circuit of FIG. 8, according to a four-phase handshake communication protocol.
Figure 11:
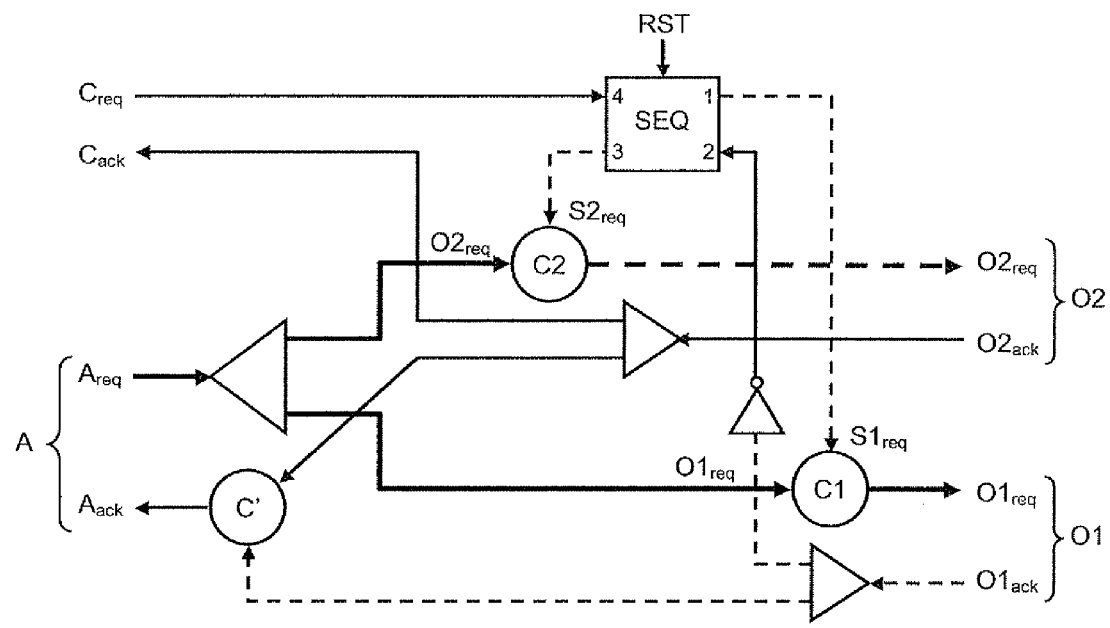

FIGS. 10 and 11 show two subsequent steps of operation of the circuit of FIG. 8. Logic levels '0' and '1' are represented as previously, respectively by arrows in dashed line and in full line.

At the step of FIG. 10, the sequencer is activated by signal $C_{req}$, set to '1' by the control circuit. As a result, signal $S1_{req}$, at output 1 of the sequencer, also switches to '1' (cf. FIG. 4). Simultaneously, request $A_{req}$ of the input channel is activated ($A_{req}=$'1') and propagates in intermediate channels $O1_{req}$ and $O2_{req}$, all the way to gates C1 and C2.

Both inputs of Muller gate C1 are at '1'. It accordingly allows the passing of request $O1_{req}$ onto the convergence operator and the output channel. Request $O2_{req}$ is currently blocked at gate C2.

Figure 5:
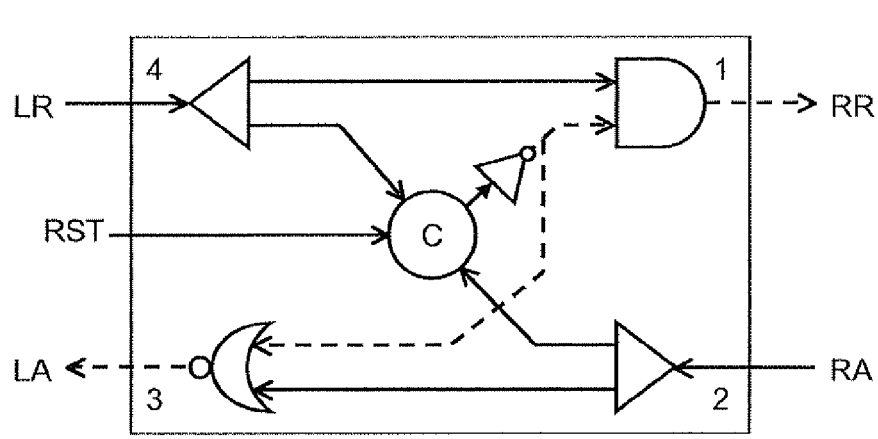

In FIG. 11, acknowledgement $O1_{ack}$ switches from its initial state '1' to active state '0', which means that request $O1_{req}$ has been properly transmitted to the output channel, Acknowledgement $O1_{ack}$ is, on the one hand, inverted ($\overline{O1_{ack}}=$'1') and directed towards input 2 of the sequencer. This enables to engage the second operating phase of the sequencer, where signal $S1_{req}$ returns to '0' (FIG. 5). On the other hand, acknowledgement signal $O1_{ack}=$'0' is propagated at the input of gate C'.

As a summary, the first two steps of the communication protocol are carried out on first intermediate channel O1 ($O1_{req}=$'1' and $O1_{ack}=$'0').

The circuit blocking occurs at this time, at the level of gate C'. Said gate does not switch, since its inputs $M_{ack}$ and $O2_{ack}$ are different from each other. Acknowledgement $A_{ack}$ at the output of gate C' is thus not generated. It remains at '0'. Thereby, the third and fourth phases of the protocol cannot be carried out on channel O1 (respectively $O1_{req}=$'1' and $O1_{ack}=$'1'), since this requires a transition of input channel A.

For this purpose, acknowledgement $O2_{ack}$ should also switch to '0'. This is made impossible by sequencer SEQ, which requires for the four phases to be first executed on channel O1 (more exactly on control channel S1, which is coupled to channel O1) before carrying on the protocol on channel O2 (via control channel S2).

To overcome this problem of blocking of gate C', the logic transition in intermediate channel O1 appears to have to be forced to pass from the second phase of the protocol to the third one.

For this purpose, a memory circuit has been introduced into intermediate channel O1. This memory circuit is capable of modifying the output state of channel O1, by means of sequencer SEQ, with no state switching of input channel A.

Figure 12:
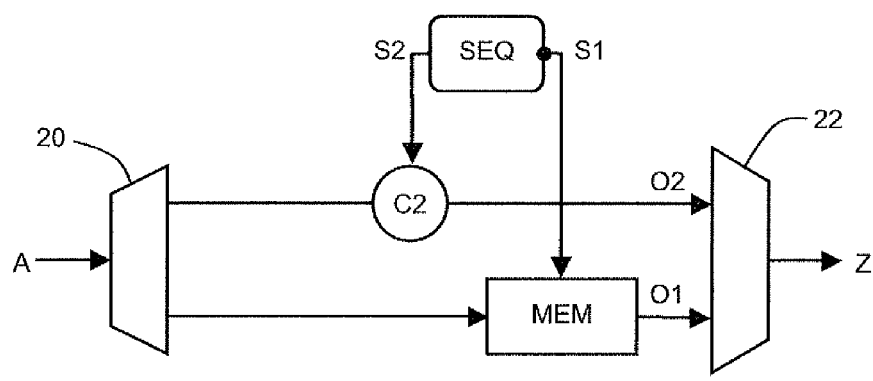
FIG. 12 is a block diagram of an asynchronous circuit with sequential write operations modified according to the invention.

FIG. 12 is a block diagram of a sequential write circuit overcoming the above-described blocking problem. This diagram shows the elements of the circuit of FIG. 2, except for switch C1, which is replaced with a memory circuit MEM.

Circuit MEM is arranged in intermediate channel O1, first in the writing sequence imposed by sequencer SEQ. Intermediate channel O2, having its request signal transmitted last to the output channel, keeps its switch C2. Said switch is preferably formed of a two-inputs Muller C-element, as previously explained in relation with FIG. 8.

Like switch C1 of FIG. 2, circuit MEM is connected to sequencer SEQ via control channel S1. Indeed, it should at certain times open channel O1 and enable the transfer from channel A to channel Z. The main function of this circuit thus remains that of a switch.

Circuit MEM is further capable of ending the communication protocol on intermediate channel O1 before acknowledging input channel A. In other words, it puts the acknowledgement of input channel A on hold, whereby it can also be called a memory.

Now, the function of a sequencer with two control channels precisely is to carry out the four phases of the protocol on one side, before continuing the protocol on the other side.

It is thus provided, in a first embodiment, to use a second sequencer, in addition to sequencer SEQ. To differentiate them, sequencer SEQ is called "main" sequencer hereafter since it controls the general circuit behavior, that is, the successive write operations on output channel Z.

Figure 13:
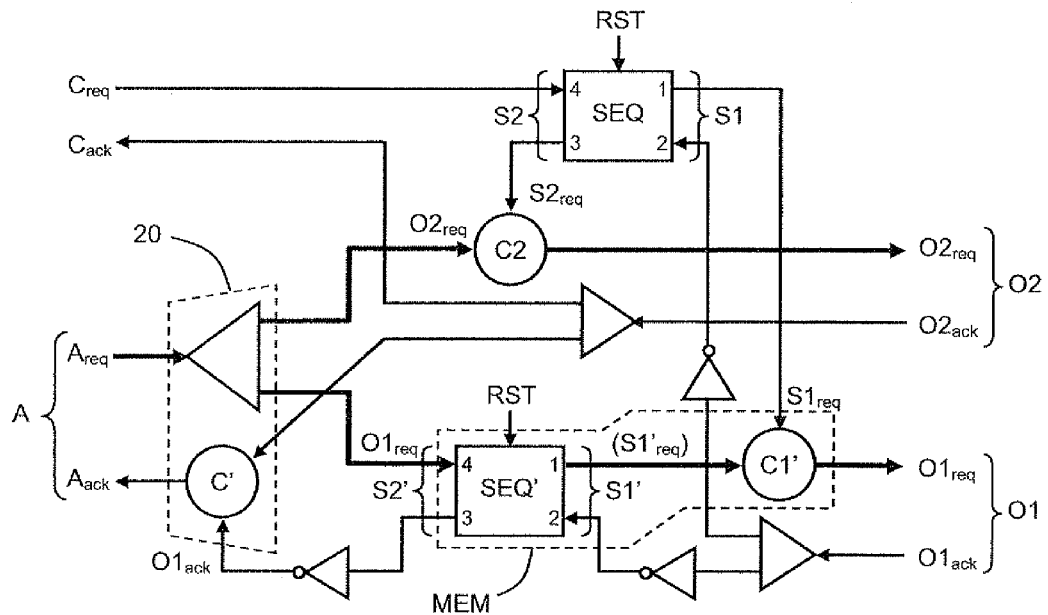
FIG. 13 shows a first embodiment of an asynchronous circuit with sequential write operations according to the invention.

FIG. 13 is a detailed view of the sequential write circuit in this first embodiment. As in FIG. 8, only a portion of the circuit has been shown, to provide a better readability.

The memory circuit comprises, in this embodiment, an additional sequencer SEQ' having an operation identical to that of main sequencer SEQ. Sequencer SEQ' has four inputs-outputs, like sequencer SEQ. The first two (output 1 and input 2) form a first control channel S1', on the right-hand side. The two others (output 3 and input 4) form a second control channel S2', on the left-hand side.

Sequencer SEQ' is arranged in intermediate channel O1, between divergence operator 20 and the convergence operator (not shown). In a way, it cuts intermediate channel O1 in two portions, one to the right of sequencer SEQ', the other one to the left. The request and acknowledgement signals at the channel input (to the left of sequencer SEQ') can thus now be distinguished from the request and acknowledgement signals at the channel output (to the right of sequencer SEQ'). The input and the output of intermediate channel O1 are defined with respect to the propagation direction of the request (from A to Z in FIG. 12).

Such a distinction is used hereafter since the logic states of the request and of the acknowledgement vary according to their position in the channel.

Thus, control channel S1' of sequencer SEQ' (to the right) is coupled to the output of intermediate channel O1 (at the input of the convergence operator) while its control channel S2' (to the left) is coupled to the input of intermediate channel O1 (at the output of divergence operator 20).

The memory circuit further comprises a Muller gate C1' also arranged in intermediate channel O1, to provide the opening and the closing of this channel. More specifically, gate C1' is arranged in the path of request $O1_{req}$ and controlled by channel S1 of main sequencer SEQ, just like gate C1 of FIGS. 8, 10, and 11.

From operator 20 to the convergence operator, request signal $O1_{req}$ of the first intermediate channel takes the following path: it crosses sequencer SEQ', entering through input 4 and coming out of output 1, and then crosses gate C1' when main sequencer SEQ allows it (according to signal $S1_{req}$ at the output of terminal 1 of sequencer SEQ).

Since gate C1' is connected to input 1 of secondary sequencer SEQ', it can also be considered that it receives as input a request signal $S1'_{req}$ from channel S1', in addition to request signal $S1_{req}$ of main sequencer SEQ.

Acknowledgement signal $O1_{ack}$ substantially follows the reverse path. It crosses sequencer SEQ', entering through input 2 and coming out of output 3, and then joins acknowledgement $O2_{ack}$ of the second intermediate channel at the input of Muller gate C'.

According to the signal conventions used for the sequencer and acknowledgement signal $O1_{ack}$, two inverters may be arranged on the path of signal $O1_{ack}$, one at input 2 of sequencer SEQ' and the other at output 3 of sequencer SEQ'.

The arrangement of channels O2, S1, S2, as well as of the control channel corresponding to signals $C_{req}$ and $C_{ack}$, is further identical to that of FIG. 8.

When the four-phase operation of the circuit of FIG. 13 is followed, especially using the steps of FIGS. 10 and 11, it can be observed that the blocking no longer occurs.

Figure 14:
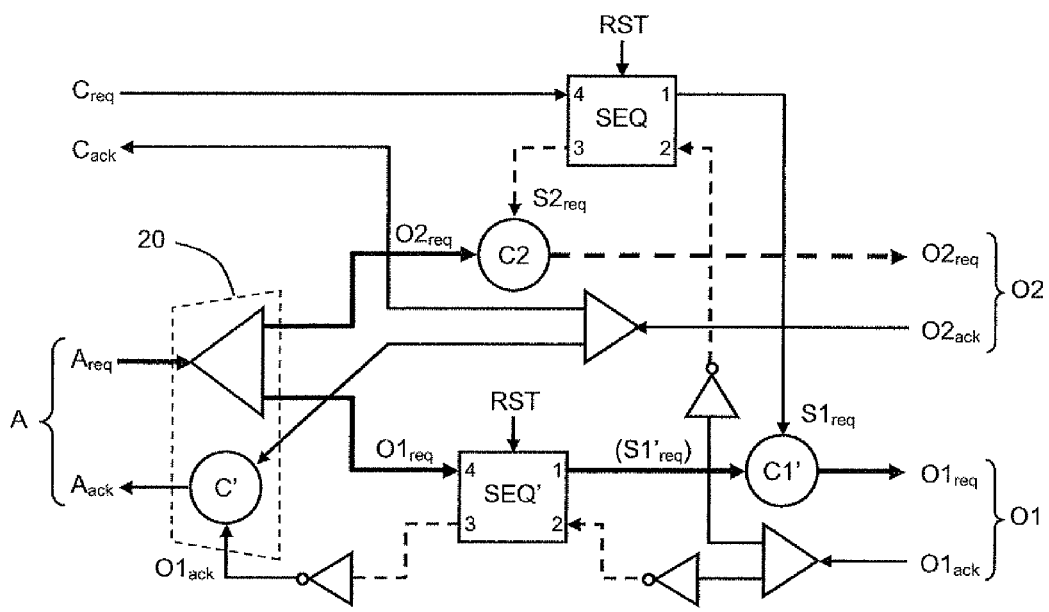
FIGS. 14 to 16 show operating steps of the circuit of FIG. 13, according to a four-phase handshake communication protocol.
Figure 15:
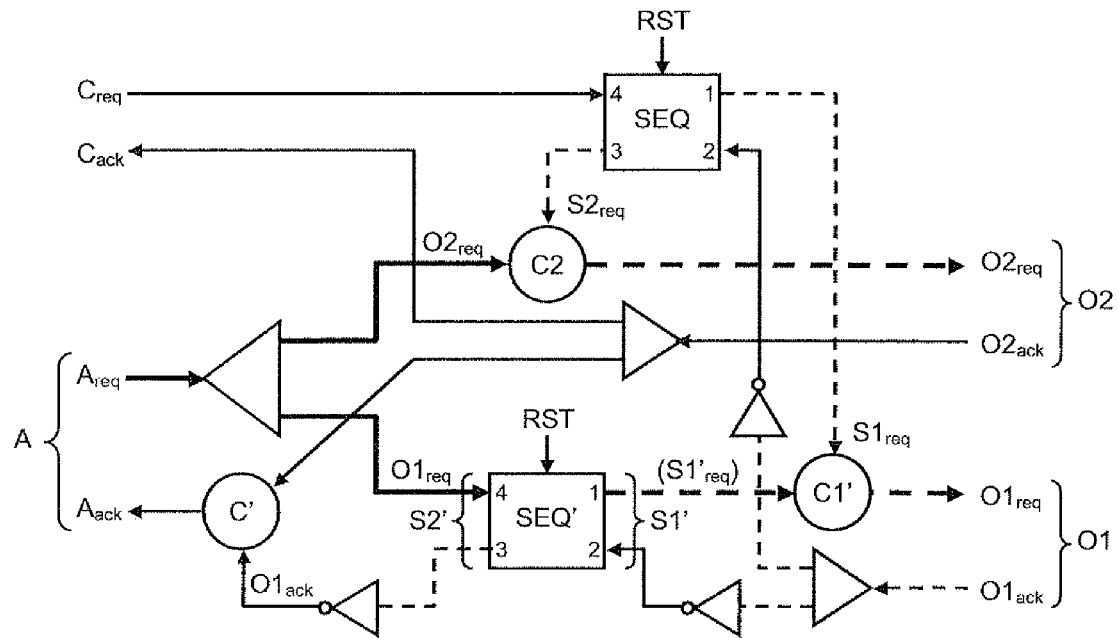
Figure 16:
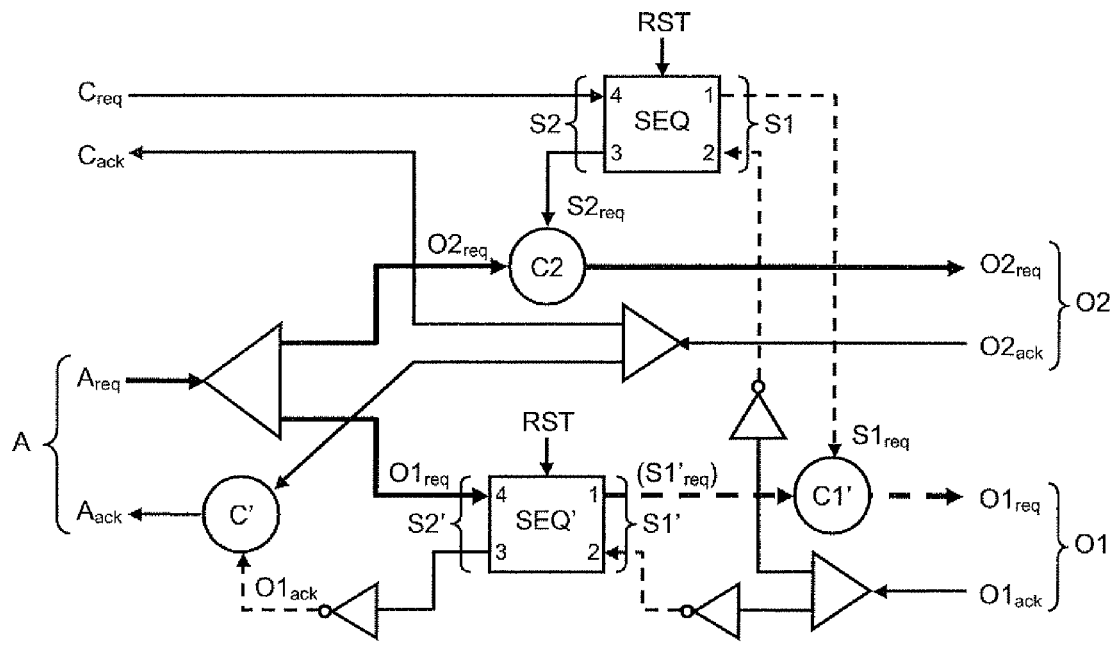

FIGS. 14 to 16 illustrate operating steps after initialization of a sequential read circuit integrating an additional sequencer SEQ'. The initial state of this sequencer is identical to that of main sequencer SEQ (see FIG. 3).

In FIG. 14, the auxiliary control circuit takes signal $C_{req}$ to '1', which initiates the writing sequence. Signal $S1_{req}$ at input 1 of sequencer SEQ then switches to '1'. Further, request $A_{req}$ of the input channel is activated ($A_{req}$='1') and propagates downstream of duplicator 20, at input 4 of sequencer SEQ' in channel O1 and to gate C2 in channel O2.

Since sequencer SEQ' behaves in the same way as the main sequencer, signal $S1'_{req}$ at input 1 of sequencer SEQ' also switches to '1'. Thus, the two inputs of gate C1' are at '1' and request $A_{req}=O1_{req}$='1' is propagated to the output channel. The first phase of the protocol has thus ended in channel O1, on the left-hand side of sequencer SEQ' (input 4) as well as on its right-hand side (output 1).

At the next step (FIG. 15), signal $O1_{ack}$ at the output of channel O1 switches state (from '1' to '0') to acknowledge receipt of request $A_{ack}$ on the output channel. This corresponds to the second phase of the protocol. Acknowledgement $O1_{ack}$ is inverted ($\overline{O1_{ack}}$='1') and directed towards input 2 of each sequencer.

At this time, sequencer SEQ' behaves as a buffer and does not propagate acknowledgement $O1_{ack}$ located at its input 2 to channel A. On the contrary, it controls a transition of its right-hand request signal $S1'_{req}$, from '1' to '0', which is reflected at the input of gate C1'.

Main sequencer SEQ behaves in the same way. Right-hand request signal $S1_{req}$ also switches to '0' (FIG. 6). Both inputs of gate C1' being at '0', signal $O1_{req}$='0' is propagated to the output channel, which corresponds to the third phase of the protocol at the output of channel O1.

At the input of channel O1, that is, on left-hand channel S2' of sequencer SEQ', nothing moves since control channel S1' has priority over control channel S2'. Accordingly, acknowledgement signal $A_{ack}$ of the input channel is not generated and request $A_{req}$ is not modified.

The step of FIG. 16 corresponds to the fourth and last phase of the protocol at the output of channel O1. Signal $O1_{ack}$ switches back to its initial state '1' to acknowledge the previous switching of signal $O1_{req}$. This inactive state of signal $O1_{ack}$ is propagated to input 2 of the two sequencers. This thus also corresponds to a fourth phase of the protocol in channels S1 and S1'.

Now, as previously described in relation with FIG. 6, the fourth phase on a right-hand channel of a sequencer is automatically followed by the second phase on the left-hand channel. Thus, output signals 3 of sequencers SEQ and SEQ' switch state, from their initial state '0' to '1'.

As a result, request $A_{req}$='1' propagates for a second time to the output channel, via intermediate channel O2 (Muller gate C2 has become conductive since $O2_{req}=S2_{req}$='1'), and acknowledgement signal $O1_{ack}$='0' progresses until gate C'.

At the following step (not shown), acknowledgement $O2_{ack}$ of the second intermediate channel will switch to '0' and the two inputs ($O1_{ack}$ and $O2_{ack}$) of gate C' will have the same values. Accordingly, acknowledgement $A_{ack}$ will be generated ($A_{ack}$='0') with no blocking.

Figure 17:
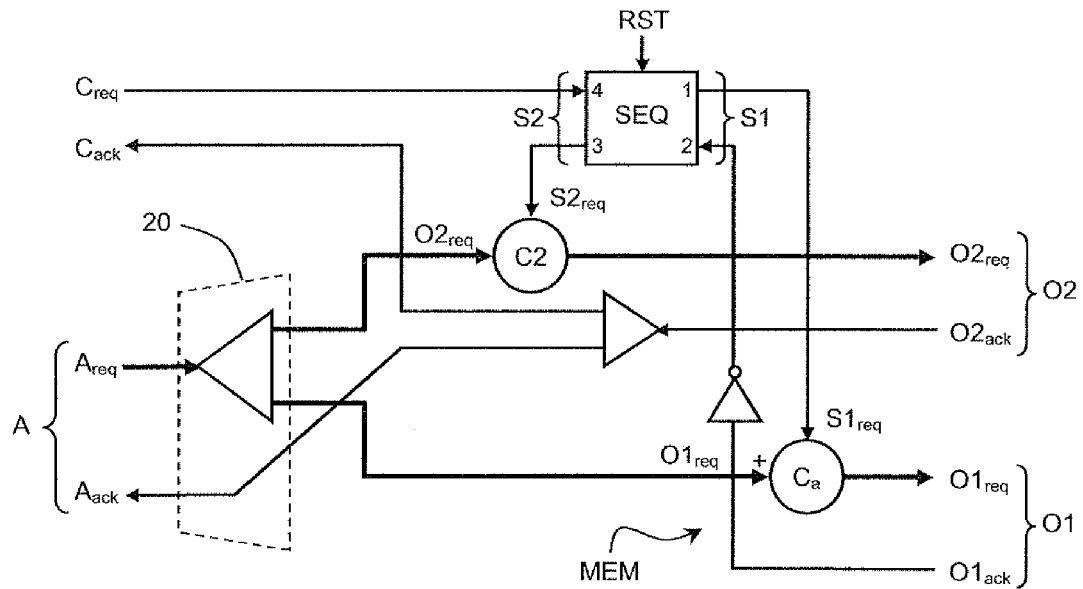
FIG. 17 shows a second embodiment of an asynchronous sequential write circuit according to the invention.

FIG. 17 shows a second embodiment of a sequential write circuit, with a guaranteed operation when simulated in four phases.

The memory circuit here comprises an asymmetrical Muller gate $C_a$. Gate $C_a$ is provided with a first input receiving request signal $O1_{req}$ from the first intermediate channel and a second input receiving request signal $S1_{req}$ from main sequencer SEQ.

An asymmetrical Muller gate is a Muller C-element having an input conditioning only one of the transitions of the gate. This input (called asymmetrical hereafter) is conventionally marked with a "+" for the rising transition (from '0' to '1') of with a "−" for the falling transition (from '1' to '0').

In other words, for the opposite transition, the other input is sufficient to cause the gate switching and the output value only depends on the value of this input.

In FIG. 17, the asymmetrical input is that receiving request signal $O1_{req}$ and the concerned transition is a rising transition.

Thus, the output signal of gate $C_a$ may switch from '1' to '0' without requiring modifying request signal $O1_{req}$. This means that sequencer SEQ alone will control the switching of gate $C_a$ and carry out the third phase of the protocol at the output of channel O1, that is, the switching of signal $O1_{req}$ from '1' to '0'.

The memory circuit function is thus well fulfilled since gate $C_a$ is capable of modifying the output state of the intermediate channel without for the input channel to switch state.

It is no longer necessary to return acknowledgement signal $O1_{ack}$ of the intermediate channel to input channel A, since the falling transition of request $A_{req}$ is not longer required. Acknowledgement $O1_{ack}$ is however still connected to input 2 of sequencer SEQ, via the inverter (second and fourth phases of the protocol on O1 and S1).

In this embodiment, the circuit thus comprises no Muller gate gathering acknowledgement signals $O1_{ack}$ and $O2_{ack}$. The acknowledgement of input channel $A_{ack}$ is only formed of acknowledgement signal $O2_{ack}$ of the second and last intermediate channel O2. Indeed, it is no longer necessary to verify acknowledgement $O1_{ack}$ to release input channel A, since it is now ascertained that the protocol has been carried out properly on channel O1. The acknowledgement of last intermediate channel O2 ensures that the writing sequence is respected.

Divergence operator 20 then consists, in this embodiment, in a simple fork which duplicates signal $A_{req}$ in the request path and to a single wire connecting signals $O2_{ack}$ and $A_{ack}$ in the acknowledgement path.

This asynchronous circuit is simpler to achieve than the circuit of FIG. 13, since it contains less logic gates. It is also faster and less energy-intensive.

It can be observed in FIG. 17 that the rising transition of the signal at the output of gate $C_a$ requires for inputs $O1_{req}$ and $S1_{req}$ to be at '1'. However, the falling transition requires a single one at '0' ($S1_{req}$). This behavior also characterizes an AND gate. Thus, in a third embodiment of the invention, asymmetrical Muller gate $C_a$ of the circuit of FIG. 17 is replaced with an AND gate.

Figure 18:
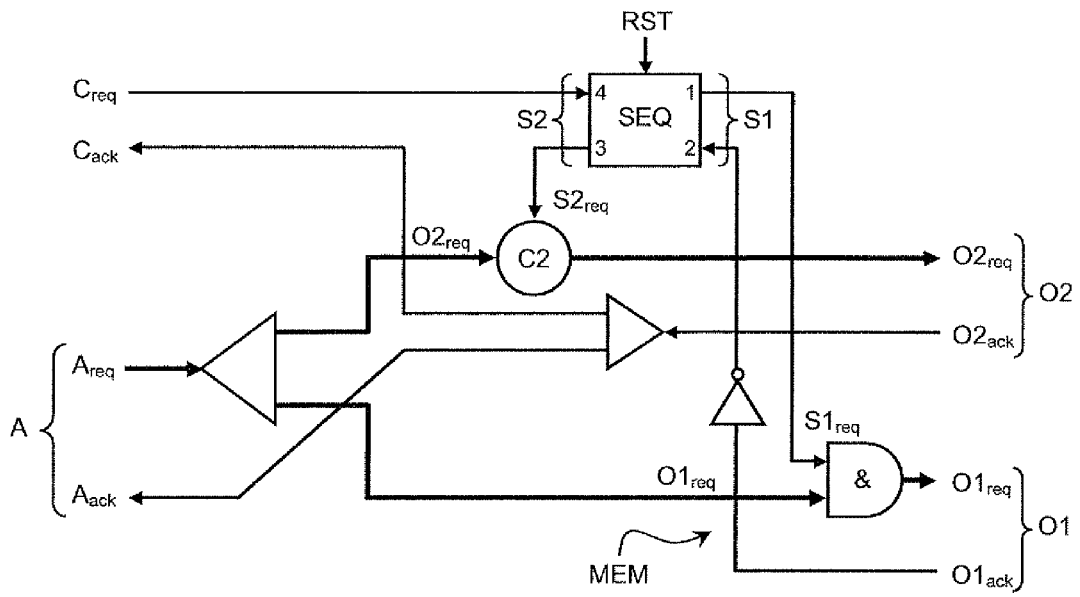
FIG. 18 shows a third embodiment of an asynchronous sequential write circuit according to the invention.

FIG. 18 shows this third embodiment of the sequential write circuit, even more simplified.

The memory circuit thus comprises a two-inputs AND gate. It is designated with symbol "&" in FIG. 18. An input of gate & is connected to output 1 of main sequencer SEQ and receives right-hand request signal $S1_{req}$. The other input is connected to an output of operator 20 and receives as input request signal $O1_{req}$ from the first intermediate channel originating therefrom.

Like the asymmetrical Muller C-element, gate & enables to lock or unlock intermediate channel O1. It further allows a transition of its output signal from a single input. Again, with such a memory circuit, it is possible to carry out the four phases of the protocol at the end of channel O1, and more specifically the third and fourth phases, without requiring any change of input channel A.

In practice, an asynchronous circuit implements a large number of channel connections. Now, only some of them concern sequential write operations. The above-described solutions can only be applied to sequential write connections. During the synthesis, the other connections may be treated more simply, for example, by being considered as a single wire.

Thus, the circuits of FIGS. 12 to 18 are only a portion of a much larger asynchronous circuit. The asynchronous circuit comprises many components or operators, also connected by channels. These components are especially located upstream of input channel A and downstream of output channel Z.

There may also be asynchronous operators in intermediate channels O1 and O2, for example, if an operation is desired to be performed on the requests (associated or not to the data) of the intermediate channels.

In the embodiments of FIGS. 13, 17, and 18, the writing sequence is controlled by an auxiliary control circuit. By activating request signal $C_{req}$, the auxiliary control circuit starts the operation of sequencer SEQ. Sequencer SEQ implements the different phases of the protocol, first on channels S1 and O1 for the first write operation, and then on channels S2 and O2 for the second write operation. The end of the sequence is notified to the control circuit by the return to the inactive state of acknowledgement signal $O2_{ack}$, that is, the acknowledgement signal of the last channel to write. A new writing sequence can only be started by the auxiliary control circuit.

Figure 19:
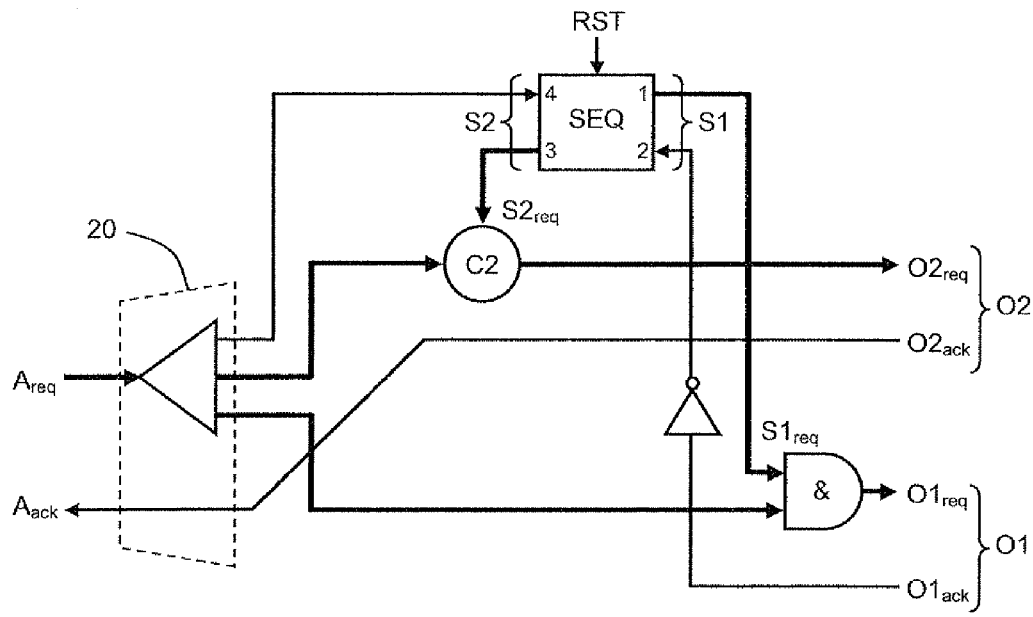
FIGS. 19 and 20 show alternative implementations for controlling the sequencer of FIG. 18.
Figure 20:
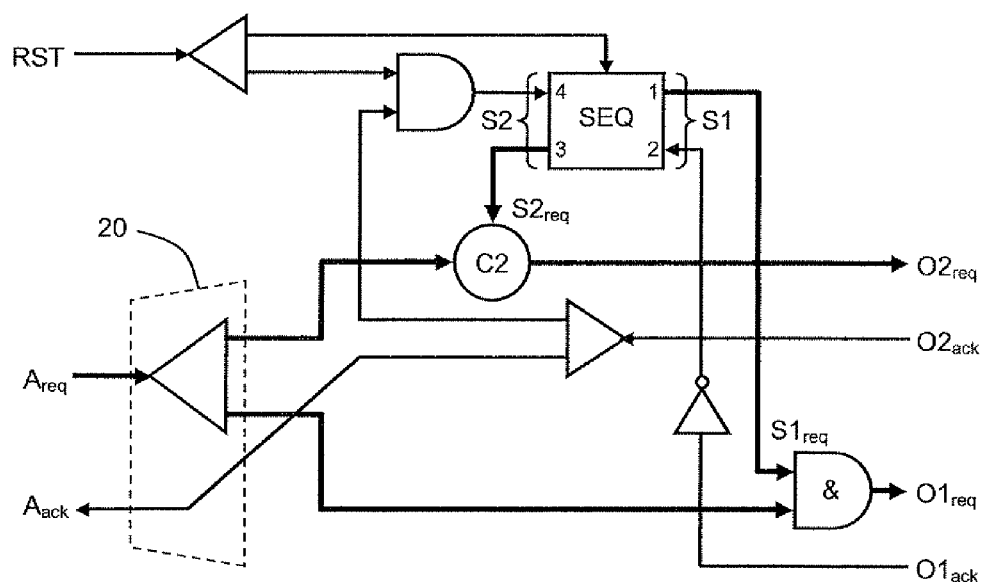

FIGS. 19 and 20 show two alternative embodiments of the control of sequencer SEQ.

Contrary to the previous case, sequencer SEQ of FIG. 19 is controlled automatically. Control channel S2 is directly coupled to input channel A. More specifically, input 4 of sequencer SEQ receives request signal $A_{req}$. This may be achieved by providing an additional output in divergence operator 20, as shown.

Thus, in the first operating phase, request signal $A_{req}$='1' propagates downstream of operator 20 in intermediate channels O1, O2 and simultaneously starts the write sequence. The auxiliary control circuit and its control signal $C_{req}$ are thus no longer needed.

It can then be observed that it is no longer necessary to loop back acknowledgement signal $O2_{ack}$ on the sequencer to start a new write sequence. A new cycle starts with a new request $A_{req}$=from the input channel, which can only occur after an acknowledgement $O2_{ack}$ from the last intermediate channel.

FIG. 20 illustrates another sequencer control mode, halfway between the two previous modes. It could be called semi-automated.

Acknowledgement signal $O2_{ack}$ of the last intermediate channel is looped back on control channel S2 of main sequencer SEQ, via an additional AND gate.

The output of the AND gate is connected to input 4 of sequencer SEQ. In input, it receives a reset signal RST, in addition to acknowledgement signal $O2_{ack}$ of the last intermediate channel.

Preferably, reset signal RST is that used for sequencer SEQ. It is thus duplicated at the input of sequencer SEQ (FIG. 20).

Several techniques are thus provided to control main sequencer SEQ. Such techniques may be jointly used in a same asynchronous circuit, but for different channel connections. They may further be combined with any embodiment of the memory circuit (FIGS. 13, 17, and 18).

Once signal RST has been released (RST='1': initialization phase over), it can be observed that the variants of FIGS. 19 and 20 become substantially equivalent. The writing sequences automatically follow one another, with signal $O2_{ack}$ as a start signal in one case, and signal $A_{req}$ in the other case. The variant with request signal $A_{req}$ enables to save a logic gate (AND gate at the sequencer input) but it is slower.

The variants of FIGS. 13, 17, and 18 (with the auxiliary control circuit) performs functions complementary to the two others. When associated with one or the other, it enables, in practice, to cover all synthesis cases.

Many other variants and modifications of the sequential write circuit described herein will occur to those skilled in the art. The circuit may especially be formed with other implementations of the sequencer, of the divergence operator or of the convergence operator.

As an example, the divergence operator may duplicate or divide input channel A into a number of intermediate channels greater than 2. In this case, main sequencer SEQ will simply be provided with a larger number of control channels, one per intermediate channel, so that the requests of the intermediate channels converge in a pre-established order.

As a variant, several sequencers with at least two control channels may be provided. The sequencers will be simply controlled with a time offset so that there will not be two intermediate channels connected to the output channel at the same time.

To ensure the proper operation of the circuit, it is sufficient to arrange in the last intermediate channel of the sequence a conventional switch, such as a Muller C-element, and in all the other channels (the first in the sequence) a memory circuit MEM such as those of FIGS. 13, 17, and 18. Thus, each intermediate channel having a circuit MEM is assured to complete the four phases of the communication protocol when its turn comes.

Finally, although the request signals of the channels have been represented by a single wire in FIGS. 13 to 20, they may be encoded over several bits (and thus conveyed by several wires). Such is generally the case when the data are associated with the request.

Figure 21:
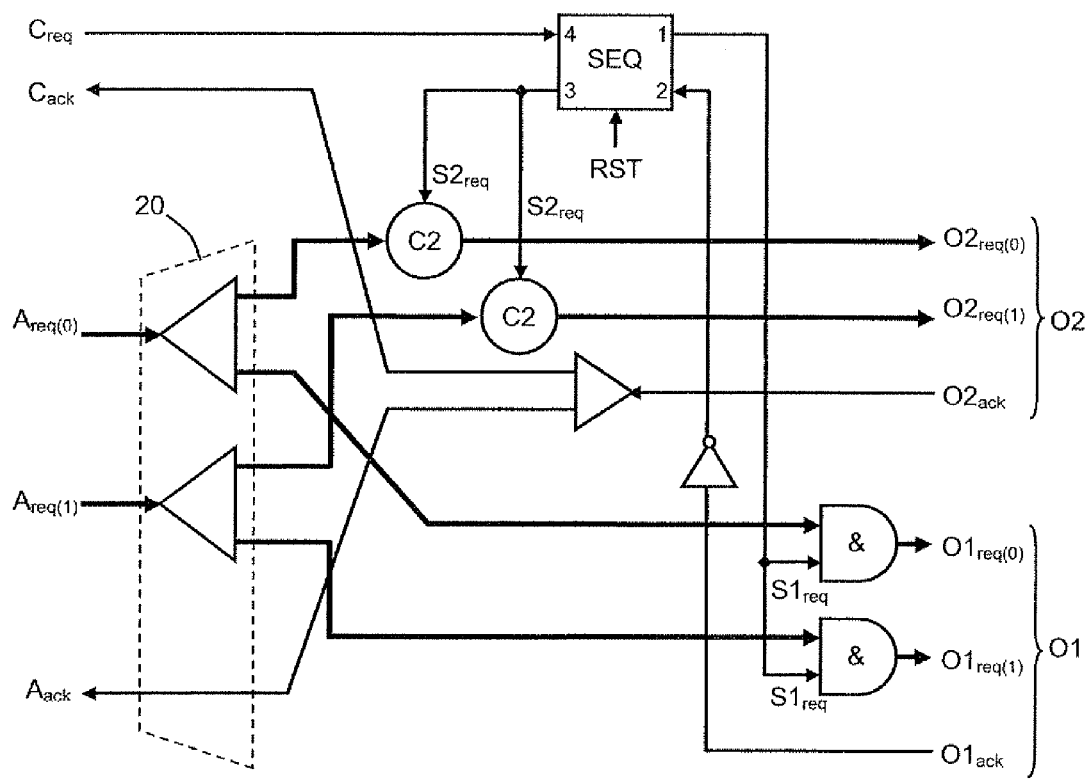
FIG. 21 shows the asynchronous sequential write circuit of FIG. 18 when the request signals are encoded over several wires.

FIG. 21 shows this specific case, based on the circuit of FIG. 18. The request of the input channel is for example encoded over two bits $A_{req(0)}$ and $A_{req(1)}$. Of course, the request of the output channel is also encoded over several bits and the write operations are performed between bits of same rank.

Each bit $A_{req(0)}$ and $A_{req(1)}$ has an associated divergence operator 20, at least two intermediate channels O1 and O2 (respectively $O1_{req(0)}$, $O1_{req(1)}$, $O2_{req(0)}$, $O2_{req(1)}$)—one with a storage circuit (gate & for example) and the other with a switch C2—and a convergence operator (not shown).

The sequencer may be common to all request wires, as shown in FIG. 21, by duplicating request signals $S1_{req}$ and $S2_{req}$ of the control channels. For example, the two gates & each receive a request signal $S1_{req}$ and the two Muller gate C2 each receive a request signal $S2_{req}$.

It is also possible to provide several sequencers, for example, one per bit of request signal $A_{req(0)}$ and $A_{req(1)}$.

We claim:

1. An asynchronous circuit comprising a plurality of components connected by channels, each channel conveying a request signal and an acknowledgement signal, said asynchronous circuit further comprising:
   an input channel;
   a divergence operator connecting the input channel to a plurality of intermediate channels;
   a convergence operator gathering the intermediate channels in a single output channel;
   a main sequencer comprising a plurality of sequentially-activated control channels, each intermediate channel being associated to a control channel;
   a switch arranged in a request path of one of the intermediate channels, and connected to the last active control channel, whereby a transmission of the request signal of said intermediate channel to the output channel occurs last in the sequence; and
   a memory circuit, arranged in each of the other intermediate channels, connected to the associated control channel and configured to transmit the request signal from the associated intermediate channel to the output channel; and
   the memory circuit being further configured to modify an output state of the associated intermediate channel, by means of the main sequencer, without requiring any state change of the input channel.

2. The asynchronous circuit according to claim 1, wherein the switch is formed of a Muller C-element receiving as inputs the request signal of the associated intermediate channel and the request signal of the associated control channel.

3. The asynchronous circuit according to claim 1, wherein the memory circuit comprises an AND gate receiving as inputs the request signal of the associated intermediate channel and the request signal of the associated control channel.

4. The asynchronous circuit according to claim 1, wherein the memory circuit comprises an asymmetrical Muller C-element provided with a first input receiving the request signal of the associated intermediate channel and with a second input receiving the request signal of the associated control channel, the first input conditioning only one of the transitions of the asymmetrical Muller C-element.

5. The asynchronous circuit according to claim 1, wherein the memory circuit comprises:
   a Muller C-element receiving as inputs the request signal from the associated intermediate channel and the request signal from the associated control channel of the main sequencer; and
   a secondary sequencer provided with a first control channel coupled to an output of the associated intermediate channel via the Muller C-element and with a second control channel coupled to an input of the associated intermediate channel.

6. The asynchronous circuit according to claim 1, wherein the last active control channel of the main sequencer receives a request signal from a control circuit.

7. The asynchronous circuit according to claim 1, wherein the last active control channel of the main sequencer receives the request signal of the input channel.

8. The asynchronous circuit according to claim 1, wherein the last active control channel of the main sequencer receives the acknowledgement signal of the associated intermediate channel and a signal for resetting the sequencer.

* * * * *